United States Patent
Murayama

(10) Patent No.: US 8,026,610 B2
(45) Date of Patent: Sep. 27, 2011

(54) SILICON INTERPOSER AND METHOD FOR MANUFACTURING THE SAME

(75) Inventor: Kei Murayama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/465,898

(22) Filed: May 14, 2009

(65) Prior Publication Data
US 2009/0283914 A1    Nov. 19, 2009

(30) Foreign Application Priority Data
May 15, 2008   (JP) ................... 2008-127918

(51) Int. Cl.
*H01L 23/52* (2006.01)
(52) U.S. Cl. ............ 257/773; 257/774; 257/E23.011; 257/E21.597
(58) Field of Classification Search .......... 257/773, 257/774, E23.011, E21.597
See application file for complete search history.

(56) References Cited

U.S. PATENT DOCUMENTS

| | | | |
|---|---|---|---|
| 6,451,634 B2 * | 9/2002 | Ma et al. ................. | 438/155 |
| 7,727,794 B2 * | 6/2010 | Shibayama ............... | 438/78 |
| 2009/0085164 A1 * | 4/2009 | Murayama et al. ....... | 257/603 |

FOREIGN PATENT DOCUMENTS

| JP | 2004-165602 | 6/2004 |
|---|---|---|
| JP | 2007-311649 | 11/2007 |

* cited by examiner

*Primary Examiner* — Zandra Smith
*Assistant Examiner* — Paul E Patton
(74) *Attorney, Agent, or Firm* — Rankin, Hill & Clark LLP

(57) ABSTRACT

A method for manufacturing a silicon interposer, includes a step of forming a protection film on a surface, on which an element portion is formed, of a silicon wafer, a step of forming open holes according to planar arrangements of through holes which pass through the silicon wafer in a thickness direction, a step of forming the through holes by etching the silicon wafer using the protection film as a mask, a step of forming an oxide film on inner wall surfaces of the through holes by a thermal oxidation, a step of forming a contact hole, which is in communication with the element portion, in the protection film, and a step of forming wirings on both surfaces of the silicon wafer. In the step of forming the wirings, one of the wirings is formed to be connected electrically to the element portion via a contact portion formed in the contact hole.

4 Claims, 5 Drawing Sheets

SILICON INTERPOSER AND METHOD FOR MANUFACTURING THE SAME

This application claims priority from Japanese Patent Application No. 2008-127918, filed on May 15, 2008, the entire contents of which are hereby incorporated by reference.

FIELD OF THE INVENTION

The present disclosure relates to a silicon interposer and a method for manufacturing the same and, more particularly, a silicon interposer in which an element portion such as a diode is formed on a surface of a silicon substrate and a method for manufacturing the same.

DESCRIPTION OF RELATED ART

The silicon interposer is interposed between a semiconductor element and a mounting substrate, and electrically connects the mounting substrate and the semiconductor element. A coefficient of thermal expansion is very different between the semiconductor element and the mounting substrate made of a resin substrate. When the semiconductor element that produces heat in operation is mounted on the mounting substrate, a great thermal stress is caused between the semiconductor element and the mounting substrate. Therefore, it is effective to mount the semiconductor element via the silicon interposer on the mounting substrate.

A silicon is used as a base material of the silicon interposer, and thus an element portion such as a diode can be formed on the silicon interposer itself. Therefore, the silicon interposer having the element portion such as the diode, or the like can be provided by building the element portion into the silicon interposer.

[Patent Literature 1] JP-A-2004-165602
[Patent Literature 2] JP-A-2007-311649

The silicon interposer includes through electrodes for connecting electrically wirings between both surfaces of the silicon interposer. The through electrodes are formed by providing through holes in the silicon substrate, and then filling a conductor metal in the through holes by a plating, or the like. Therefore, inner wall surfaces of the through holes must be covered with an insulating film to insulate electrically the through electrodes from the silicon substrate. As a method for covering the inner wall surfaces of the through holes with the insulating film, a method for utilizing a low-temperature chemical vapor deposition (CVD) or a method for forming an oxide film by utilizing a thermal oxidation may be considered.

A method for forming a protection film by the low-temperature CVD method has such an advantage that the element portion formed on the silicon substrate is not damaged by the heat, or the like, nevertheless there are disadvantages that a dense insulating film such as an oxide film cannot be formed and also it is difficult to form uniformly an insulating film on the through holes whose aspect ratio is large. Meanwhile, the method for forming the oxide film by utilizing the thermal oxidation is preferable in respect of insulating capability, but the thermal oxidation must be conducted at a high temperature of 800° C. or more. Therefore, characteristics of the element portion formed by diffusing an impurity into the silicon substrate are influenced by such high temperature.

SUMMARY OF INVENTION

Illustrative aspects of the present invention provide a silicon interposer capable of providing electrical insulation between through electrodes and a silicon substrate without fail and also connecting electrically an element portion, formed on the silicon substrate, and wirings without fail, and a method for manufacturing the same.

According to a first aspect of the present invention, a silicon interposer is provided with: a silicon substrate; an element portion made of an impurity diffusion layer, the element portion formed on one surface of the silicon substrate; a protection film which covers a surface of the element portion; a contact portion provided in the protection film; and a plurality of wirings formed on both surfaces of the silicon substrate. One of the wirings, which is formed on the surface on which the element portion is formed, is connected electrically to the element portion via the contact portion.

According to a second aspect of the present invention, the protection film may be made of a SiN film.

According to a third aspect of the present invention, the silicon interposer may further include a plurality of through electrodes which passes through the silicon substrate in a thickness direction. The through electrodes may be insulated electrically from the silicon substrate by an oxide film that covers inner wall surfaces of through holes formed in the silicon substrate.

According to a fourth aspect of the present invention, a method for manufacturing a silicon interposer includes a step of forming a protection film on a surface, on which an element portion made of an impurity diffusing layer is formed, of a silicon wafer, a step of forming open holes, according to planar arrangements of through holes which pass through the silicon wafer in a thickness direction, on the protection film, a step of forming the through holes by etching the silicon wafer using the protection film as a mask, a step of forming an oxide film on inner wall surfaces of the through holes by a thermal oxidation; a step of forming a contact hole, which is in communication with the element portion, in the protection film and a step of forming wirings on both surfaces of the silicon wafer. In the step of forming the wirings, one of the wirings is formed to be connected electrically to the element portion via a contact portion formed in the contact hole.

According to a fifth aspect of the present invention, the step of forming the contact hole in the protection film, may include a step of forming a first contact hole in communication with the element portion and a second contact hole in communication with the silicon wafer. The step of forming the wirings may include a step of forming a first wiring connected electrically to the element portion via a first contact portion formed in the first contact hole and forming a second wiring connected electrically to the silicon wafer via a second contact portion formed in the second contact hole.

According to a sixth aspect of the present invention, the step of forming the wirings on both surfaces of the silicon wafer, may includes: a step of forming a plating seed layer on a surface on which the protection film is formed, the plating seed layer including two layers of a Ti seed layer, which brings the plating seed layer into contact with the element portion, and a Cu seed layer, which is stacked on the Ti seed layer; a step of forming resist patterns according to planar arrangements of the wirings; and a step of forming conductor portions serving as the wirings by an electroplating using the plating seed layer as a plating power feeding layer.

According to a seventh aspect of the present invention, after the Ti seed layer is formed, a laser beam may be emitted onto a position of the contact hole such that Ti and the element portion are alloyed by heating locally the Ti seed layer.

According to an eighth aspect of the present invention, in the step of forming the protection film, the protection film may be made of a SiN film.

DETAILED DESCRIPTION OF EXEMPLARY EMBODIMENTS (Silicon Interposer Manufacturing Method)

FIGS. 1A to 1E show steps required until forming an element portion on a surface of a silicon wafer 10 serving as a base material of a silicon interposer by forming an impurity diffusing layer, and then forming through holes used to form through electrodes in the silicon wafer 10.

Figure 1A:
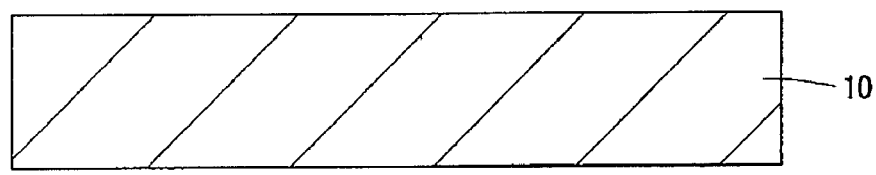
FIGS. 1A to 1E are sectional views showing steps of manufacturing a silicon interposer.
Figure 1B:
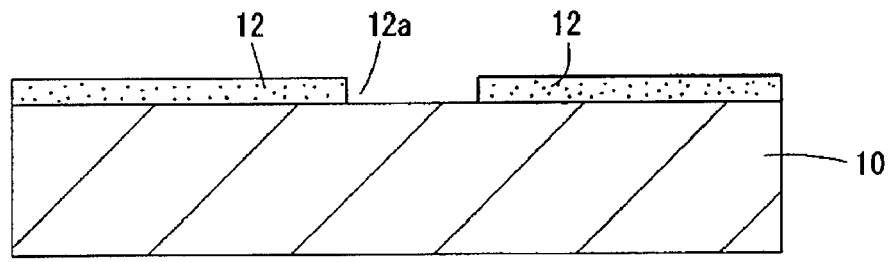

FIG. 1A shows the silicon wafer 10, and FIG. 1B shows a state that a resist pattern 12 used to form the element portion is formed on a surface of the silicon wafer 10. A large number of silicon interposers are formed from a sheet of silicon wafer 10. The resist pattern 12 is patterned every unit area of the silicon interposers, which are formed on the silicon wafer 10, to meet an arrangement of the elements portions. Here, constituent portions of the silicon interposer as one unit constituting the silicon wafer 10 are shown in following FIGS. 1C to 1E.

Figure 1C:
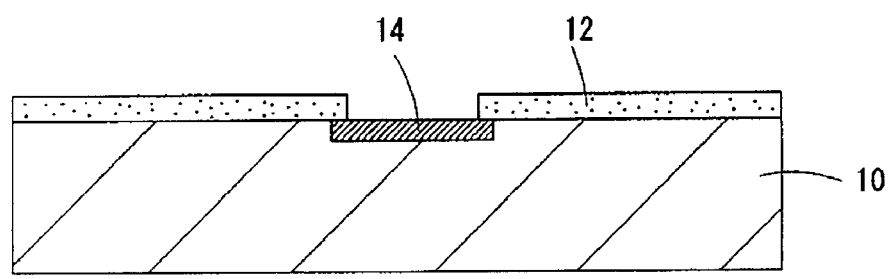
Figure 1D:
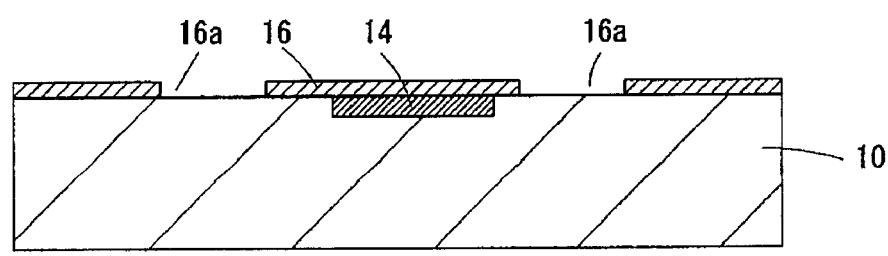

FIG. 1C shows a state that an element portion 14 formed of an impurity diffusing layer is formed by doping an impurity into one surface of the silicon wafer 10. The element portion 14 is formed by diffusing the impurity into the silicon wafer 10 through an open hole 12a that is formed in the resist pattern 12. For example, the silicon wafer 10 is formed by an n-type semiconductor, and a p-type diffusion layer is formed by diffusing a p-type impurity, e.g., boron (B), into the silicon wafer 10, whereby a diode is constructed by the n-type area and the p-type area.

After the element portion 14 is formed, a protection film 16 covers on the surface of the silicon wafer 10, on which the element portion 14 is formed, as shown in FIG. 1C. The protection film 16 covers the surface of the silicon wafer 10 excepting portions in which through holes are formed, such that the portions in which the through holes are formed serve as open holes 16a. The protection film 16 functions as a mask used to form the through holes in the silicon wafer 10 and as a protection layer used to protect the element portion 14. For example, a SiN layer may be used for the protection film 16 having these functions.

In order to form the protection film 16 by using the SiN, there is a method for forming the SiN layer on the surface of the silicon wafer 10 by a CVD method after the resist pattern 12 is removed, then forming another resist pattern in which portions where the through holes are formed are exposed from a surface of the SiN layer, and then removing the exposed portions of the SiN layer by dry etching using the other resist pattern as a mask. There is also a method for forming a pattern of a resist on the surface of the silicon wafer 10 to cover portions where the through holes are formed after the resist pattern 12 is removed, then applying the sputtering the SiN, and then removing the resist together with the SiN layer in located the portions to which the resist is adhered by the lift-off. The SiN layer serving as the protection film 16 may be formed with about 0.2 μm thick.

Figure 1E:
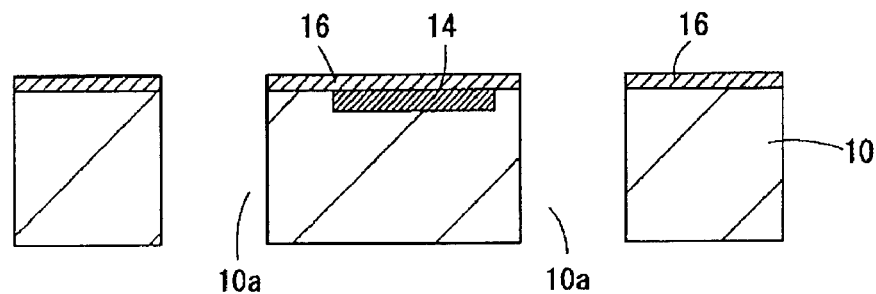

FIG. 1E shows steps of forming through holes 10a in the silicon wafer 10. The through holes 10a are formed by using the dry etching using the protection film 16 as a mask. The through holes 10a are formed according to positions of the open holes 16a. The through holes 10a may be formed by using a wet etching process instead of the dry etching process. In both cases, the element portion 14 is protected by the protection film 16 and the through holes 10a are formed.

FIGS. 2A to 2D shows steps of forming through electrodes in the silicon wafer 10 and forming contact holes in the protection film 16.

Figure 2A:
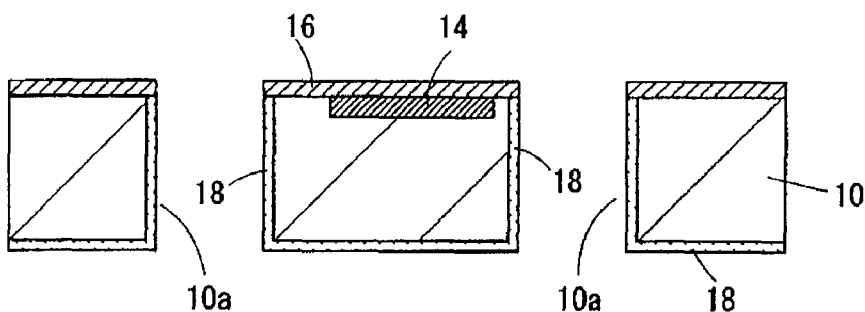
FIGS. 2A to 2D ;are sectional views showing steps of manufacturing the silicon interposer.

FIG. 2A shows a step of forming an oxide film 18 on the through holes 10a as an electrically insulating film. In the exemplary embodiment, the oxide film 18 is formed by heating the silicon wafer 10 at 1100° C. for five hours in the atmosphere. A film thickness of the oxide film 18 is set to about 0.5 μm.

The oxide film 18 is formed on exposed surfaces of the silicon wafer 10, that is, on an inner wall surfaces of the through holes 10a and on a surface opposite to the surface on which the element portion 14 is formed. The oxide film ($SiO_2$ film) is formed as a dense insulating film, and is formed on the exposed surfaces of the silicon wafer 10 to have a uniform thickness There is such an advantage that, even when either each of the through holes 10a has an excessively narrow diameter or an aspect ratio of the through hole 10a is large, the oxide film 18 can be formed surely.

When the protection film 16 is made of the SiN film, a thin SiON layer is formed on a surface of the SiN film by the thermally oxidizing step. Since the SiON layer is formed as a thin layer, the SiON layer does not do a particular action in the present manufacturing steps.

In the exemplary embodiment, the surface of the silicon wafer 10 on which the element portion 14 is formed is covered with the protection film 16. Therefore, there is such an advantage that the element portion 14 can be protected from the heat in the thermal oxidizing step applied to form the oxide film 18. In particular, when the SiN film is used as the protection film 16, there is such an advantage that, because heat resistance of the SiN film is high, the element portion 14 can be effectively protected from the heat.

Figure 2B:
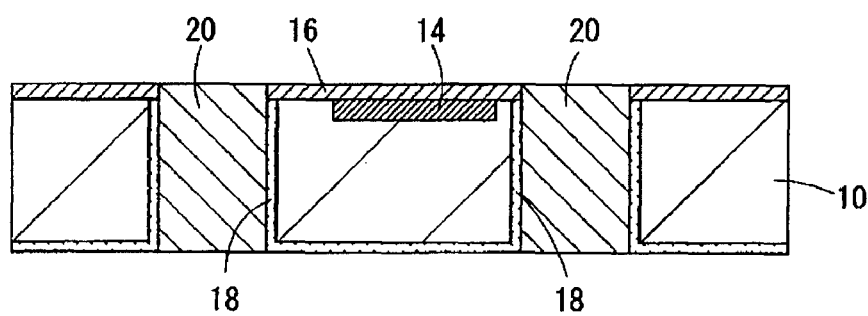

FIG. 2B shows a step of forming through electrodes 20.

The through electrodes 20 can be formed by putting a copper foil on the surface (the other surface) of the silicon wafer 10 opposed to the surface on which the element portion 14 is formed, and then filling a copper plating into the through holes 10a by a copper electroplating using the copper foil as a plating power feeding layer. As another method, the through electrodes 20 can be formed by forming a plating seed layer on the inner wall surfaces of the through holes 10a by a copper electroless plating, and then filling the copper plating into the through holes 10a by applying the copper electroplating using the plating seed layer as the plating power feeding layer.

Figure 2C:
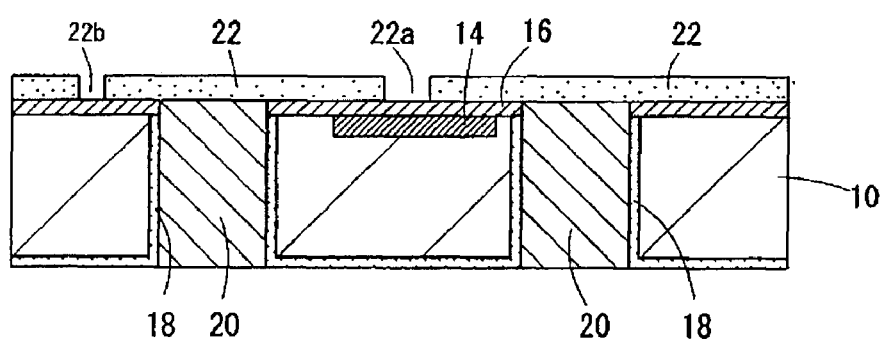
Figure 2D:
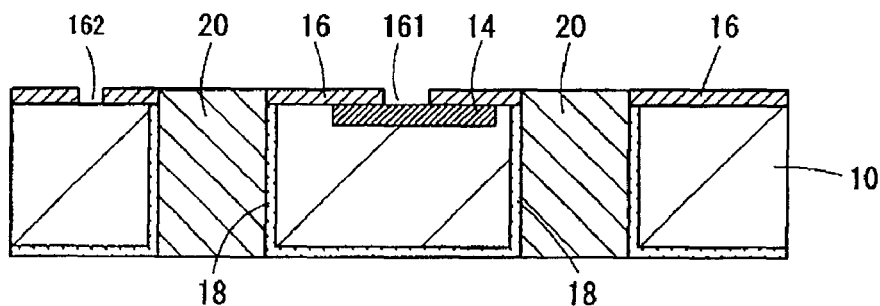

FIGS. 2C and 2D show steps of forming contact holes in the protection film 16.

FIG. 2C shows a state that a resist pattern 22 is formed on the surface, which is covered with the protection film 16, of the silicon wafer 10. In the resist pattern 22, portions in which a contact hole is formed respectively are opened. In the resist pattern 22, an open hole 22a is formed in a portion that is connected to the element portion 14, and an open hole 22b is formed in a portion that is connected to the base material of silicon.

FIG. 2D shows a state that contact holes 161, 162 are formed in the protection film 16 by etching the protection film 16 using the resist pattern 22 as a mask. The contact hole 161 is formed such that a surface of the element portion 14 is exposed. The contact hole 162 is formed such that the base material of the silicon wafer 10 is exposed.

Figure 3A:
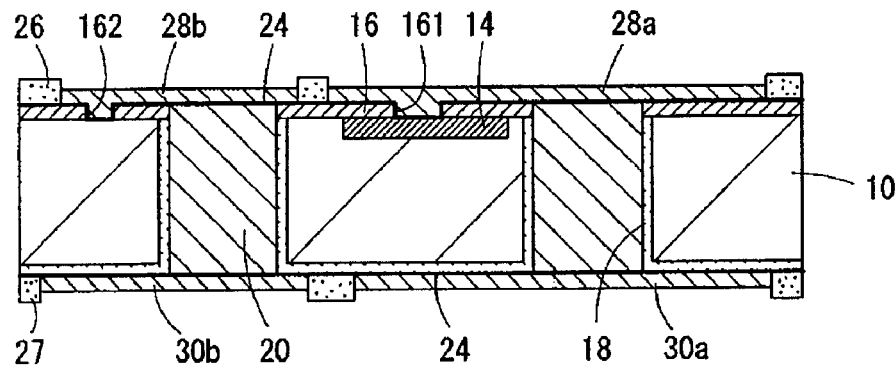
FIGS. 3A to 3C are sectional views showing steps of manufacturing the silicon interposer.
Figure 3B:
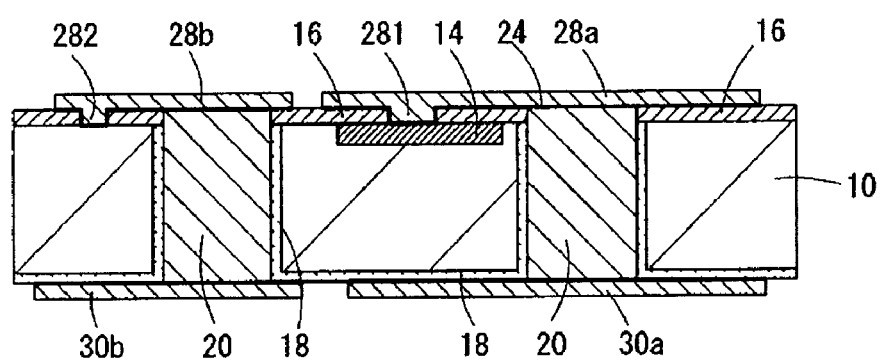
Figure 3C:
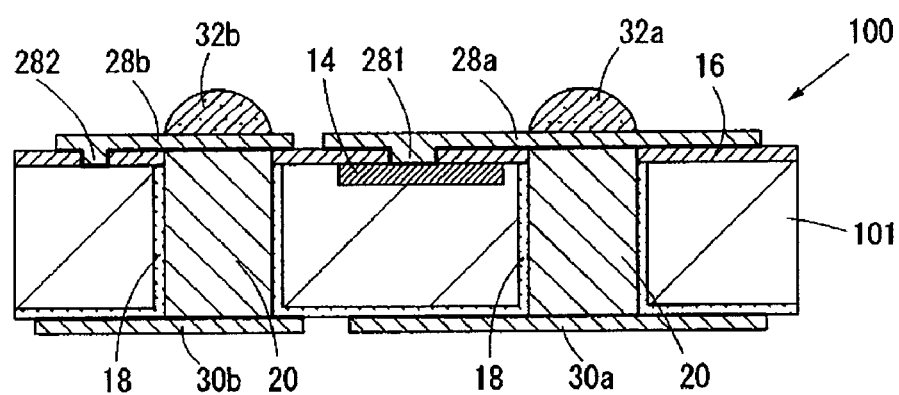

FIGS. 3A to 3C show steps of forming connecting electrodes (wirings) on both surfaces of the silicon wafer 10, and forming a connecting bump on the electrodes respectively.

FIG. 3A shows a state that a plating seed layer 24 is formed on both surfaces of the silicon wafer 10, then resist patterns 26, 27 are formed in accordance with electrode arrangements, and then electrodes 28a, 28b, 30a, 30b are formed by electroplating using the plating seed layer 24 as a power feeding layer. The resist patterns 26, 27 are formed as patterns in which the plating seed layer 24 is exposed to meet the planar arrangements in which the electrodes 28a, 28b, 30a, 30b are formed respectively.

The plating seed layer 24 is formed by stacking a Cu seed layer on a Ti seed layer. The Ti seed layer is provided to improve adhesion between the element portion 14 and the electrodes. The electrodes 28a, 28b, 30a, 30b are formed by first applying the copper plating, then applying a nickel plating, and then applying a gold plating respectively. A copper layer formed by the copper plating is main portions of the electrodes 28a, 28b, 30a, 30b. The nickel plating is provided as a barrier layer to prevent from diffusing the plated gold into the copper layer. The gold plating is provided as a protection plating for the electrodes 28a, 28b, 30a, 30b.

FIG. 3B shows a state that exposed portions (unnecessary portions) of the plating seed layer 24 (the Ti seed layer, the Cu seed layer) are removed by the etching after the resist patterns 26, 27 are removed.

The electrode 28a, which is connected electrically to the element portion 14 via a contact portion 281, and the electrode 28b, which is connected electrically to the base material of the silicon wafer 10 via a contact portion 282, are formed on the surface (one surface) of the silicon wafer 10 on which the element portion 14 is formed. The electrodes 30a, 30b are formed on the other surface of the silicon wafer 10.

The electrode 28a and the electrode 28b are connected electrically via the through electrode 20 to the electrode 30a and the electrode 30b, respectively.

FIG. 3C shows a state that gold bumps 32a, 32b are formed on the electrodes 28a, 28b as connecting bumps, respectively. The gold bumps 32a, 32b can be formed by a ball bonding using a gold wire. As the connecting bumps, solder bumps, and the like can be employed in addition to the gold bumps.

After the gold bumps 32a, 32b are formed, the silicon wafer 10 is diced in unit area of the silicon interposer. Thus, individual silicon interposers 100 can be obtained.

In the silicon interposer 100 obtained by the manufacturing method of the exemplary embodiment, the electrodes (wirings) 28a, 28b, 30a, 30b are formed on both surfaces of a silicon substrate 101, respectively. The electrodes 28a, 28b formed on one surface of the silicon substrate 101 and the electrodes 30a, 30b formed on the other surface of the silicon substrate 101 are respectively connected electrically via the through electrode 20 made of copper.

The electrode 28a formed on one surface of the silicon substrate 101 is connected electrically to the element portion 14 via the contact portion 281, and the electrode 28b is connected electrically to the silicon substrate 101 via the contact portion 282. The gold bumps 32a, 32b are attached to the electrodes 28a, 28b as the connecting bumps.

The silicon interposer may be manufactured in a state that no connecting bump is provided on the electrodes 28a, 28b. The silicon interposer may be manufactured by providing in advance the connecting bump on the electrodes 30a, 30b provided on the other surface of the silicon substrate 101.

Figure 4A:
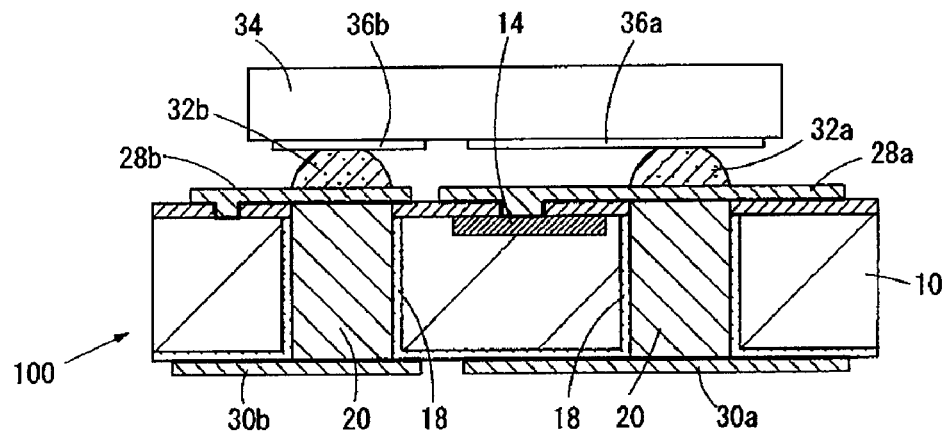
FIGS. 4A and 4B are sectional views showing steps of mounting a light emitting diode (LED) on a mounting substrate via the silicon interposer.

FIG. 4A shows a state that a light emitting diode (LED) 34 is mounted on the silicon interposer 100 as a semiconductor element. Electrodes 36a, 36b formed on one surface of the LED 34 and the electrodes 28a, 28b formed on one surface of the silicon interposer 100 are connected via the gold bumps 32a, 32b respectively. The electrodes 36a, 36b are made of a gold layer respectively. When the LED 34 and the silicon interposer 100 are joined together by using an ultrasonic wave, the electrodes 36a, 36b and the gold bumps 32a, 32b are gold-gold joined to each other.

Figure 4B:
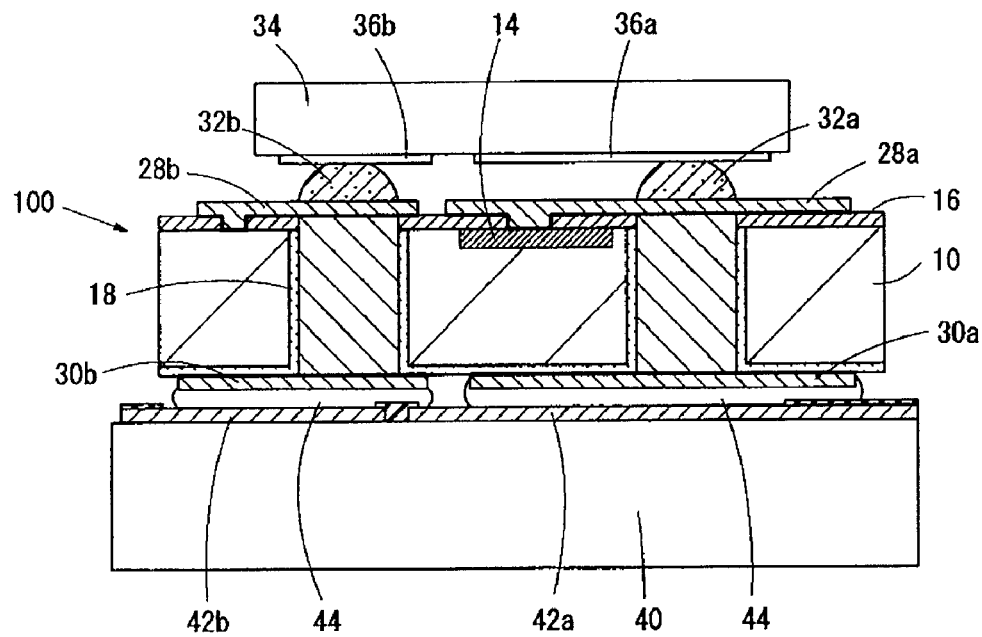

FIG. 4B shows a state that the silicon interposer 100 on which the LED 34 is mounted is mounted on a mounting substrate 40. The electrodes 30a, 30b formed on the other surface of the silicon interposer 100 are respectively connected to wirings 42a, 42b formed on the mounting substrate 40, via solders 44.

The LED 34 is mounted in such a situation that the LED 34 is connected electrically to the mounting substrate 40 via the silicon interposer 100. The element portion 14 is connected electrically to the electrode 28a. An electric circuit in which the element portion (diode) 14 is arranged in parallel with the electrodes 36a, 36b of the LED 34 is formed.

An antistatic measure must be adopted depending on the LED element products. When the LED element requiring the antistatic measure should be mounted, the silicon interposer 100 in which the diode (Zener diode) is built can be used like the exemplary embodiment. The silicon interposer to which the antistatic measure has been applied can be provided without mounting the diode as a separate component. As a result, an assembling step of the products can be simplified and the products can be manufactured in compact size.

(Examples of Other Manufacturing Steps)

Figure 5A:
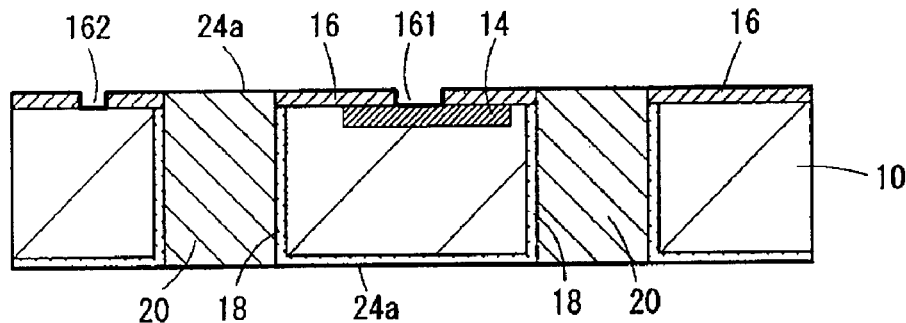
FIGS. 5A to 5C are sectional views showing other steps of manufacturing a silicon interposer.
Figure 5B:
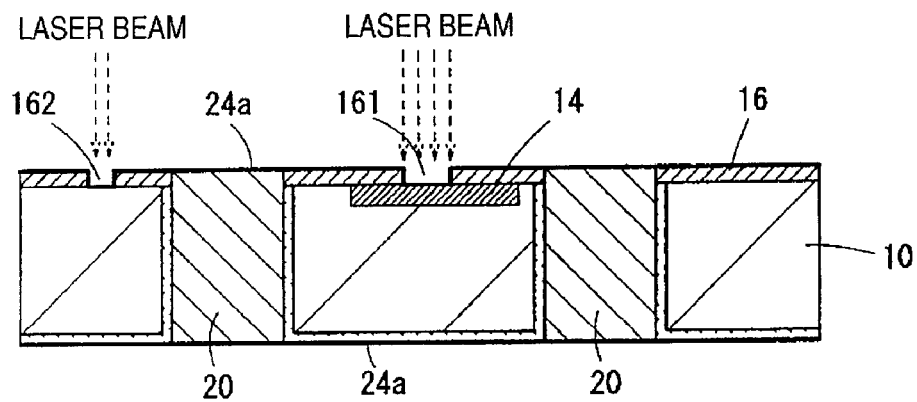
Figure 5C:
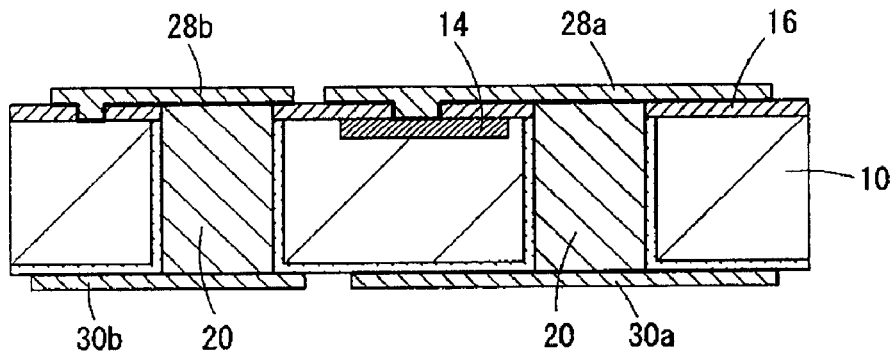

FIGS. 5A to 5C show examples of other steps of forming the electrodes 28a, 28b, 30a, 30b on both surfaces of the silicon wafer 10 after the contact holes 161, 162 are formed in the protection film 16.

FIG. 5A shows a state that a Ti seed layer 24a is formed on both surfaces of the silicon wafer 10 as an underlying layer of the plating seed layer. As described above, the Ti seed layer 24a is provided to make sure of an electrical connection between the element portion 14 and the electrode 28a. The element portion 14 and the electrode 28a must be ohmic-joined. The Ti seed layer 24a is provided to get an ohmic contact by alloying Ti and the element portion 14. In order to alloy the Ti seed layer and the element portion (impurity diffusion layer), an annealing process is needed by heating the Ti seed layer and the element portion at about 500° C.

However, the through electrodes (Cu) 20 whose coefficient of thermal expansion is considerably different from that of the silicon are formed on the silicon wafer 10. Therefore, when the overall silicon wafer is heated at about 500° C. in the annealing process, a thermal stress is caused between the through electrodes 20 and the silicon wafer 10. As a result, the seed layer and the electrodes formed on the surfaces of the silicon wafer 10 come off.

In the exemplary embodiment, in order to avoid that the overall silicon wafer 10 is heated in this manner, the annealing is done by laser-heating locally only the portions where the Ti seed layer 24a contacts the silicon wafer 10, i.e., the portions where the contact holes 161, 162 are formed, as shown in FIG. 5B.

According to the method for annealing only the portions where the contact holes 161, 162 are formed by heating locally, the silicon wafer 10 and the Ti seed layer 24a can be ohmic-joined by alloying the silicon wafer and the Ti seed layer 24a. Since other areas where the through electrodes 20, etc. are arranged are not heated, a thermal stress caused in the silicon wafer 10 can be avoided. According to the method for emitting the laser beam onto the contact holes 161, 162, the local heating up to about 500° C. can be easily done, and also it can be easily done that a heat treatment is applied to all contact holes that are formed in the silicon wafer 10.

FIG. 5C shows a state that, after the laser heating process is applied, the Cu seed layer is formed as the plating seed layer, then the resist pattern for forming electrodes is formed, then the electrodes 28a, 28b, 30a, 30b are formed by applying the plating using the plating seed layer as a power feeding layer for the plating, and then unnecessary portions of the resist pattern and the plating seed layer are removed.

The steps applied after the electrodes 28a, 28b, 30a, 30b are formed are similar to those shown in FIGS. 3A to 4B.

The silicon interposer explained in the above exemplary embodiment is provided as a product in which the LED is mounted. But the silicon interposer is applicable to not only the LED but also a semiconductor element such as common semiconductor chip, a chip size package (CSP), and the like.

Also, the element portion formed in the silicon interposer is not limited to the case where the diode consisting of a PN structure is formed, like the above exemplary embodiment. A photoreceptor device can be formed by constructing the impurity diffusion layer appropriately. Also, a capacitor structure and a resistor structure can be built into the silicon interposer.

The electrodes (wirings) formed on the surface of the base material of the silicon interposer can designed appropriately depending on a semiconductor element product mounted on the silicon interposer.

The silicon interposer employs the silicon wafer as the base material, and thus a passive element and an active element can be built into the base material itself. Therefore, the silicon interposer can be provided as a product that can make good use of a feature of silicon wafer as a material. Also, since a function of a circuit component such as the diode, or the like is attached to the silicon interposer itself, the assembling step of the product can be simplified and also a manufacturing cost can be reduced. Since a size reduction of the product can be achieved effectively, the silicon interposer of the exemplary embodiment can be utilized preferably in the field of small-size products.

The above manufacturing steps of the present invention are useful particularly to the case where a thermal oxidation film should be formed on the silicon interposer into which an impurity is doped. Also, the thermal oxidation film is effective in improving an insulating reliability.

While the present inventive concept has been shown and described with reference to certain exemplary embodiments thereof, it will be understood by those skilled in the art that various changes in form and details may be made therein without departing from the spirit and scope of the invention as defined by the appended claims.

What is claimed is:

1. A silicon interposer comprising:
   a silicon substrate, said silicon substrate having a first surface and a second surface and defining a through hole that extends from said first surface to said second surface;
   an element portion made of an impurity diffusion layer, the element portion being formed on said first surface of the silicon substrate;
   a protection film that covers a surface of the element portion and said first surface of said silicon substrate, said protection film being made of a SiN film;
   a contact portion provided in the protection film and connected to said element portion;
   a through electrode, said through electrode being received in said through hole and passing through the protection film and the silicon substrate in a thickness direction from said first surface to said second surface;
   an oxide film formed on inner wall surfaces of the through hole and said second surface of said silicon substrate, said oxide film, which is formed of a material that is different than said SiN film, electrically insulates the through electrode from the silicon substrate;
   a first plurality of wirings formed on said protection film; and,
   a second plurality of wirings formed on the second surface of the silicon substrate, wherein
   one of the first plurality of wirings, which is formed on the protection film, is connected electrically to the element portion via the contact portion.

2. The silicon interposer according to claim 1, wherein an end surface of the through electrode is free of the protection film, flush with a surface of the protection film, and covered by said first plurality of wirings.

3. The silicon interposer according to claim 1, wherein the oxide film is made of a $SiO_2$ film.

4. The silicon interposer according to claim 1, wherein a plating seed layer is formed on the protection film, and
   the plating seed layer includes a Ti seed layer that brings the plating seed layer into contact with the element portion, and a Cu seed layer that is stacked on the Ti seed layer.

* * * * *